(12) United States Patent
Weng et al.

(10) Patent No.: US 6,637,002 B1
(45) Date of Patent: Oct. 21, 2003

(54) DECODER FOR ERROR CORRECTING BLOCK CODES

(75) Inventors: Lih-Jyh Weng, Needham, MA (US); Ba-Zhong Shen, Shrewsbury, MA (US); Shih Mo, Milpitas, CA (US); Chung Chang, San Jose, CA (US)

(73) Assignee: Maxtor Corporation, Longmont, CO (US)

(*) Notice: Subject to any disclaimer, the term of this patent is extended or adjusted under 35 U.S.C. 154(b) by 0 days.

(21) Appl. No.: 09/176,658

(22) Filed: Oct. 21, 1998

(51) Int. Cl.$^7$ ............................................. H03M 13/00
(52) U.S. Cl. ...................... 714/781; 708/507
(58) Field of Search ................... 714/781, 782, 714/758, 784, 757, 704, 746, 797, 772, 785; 708/492, 507, 508, 509, 620, 631, 320, 313

(56) References Cited

U.S. PATENT DOCUMENTS

| | | | | |
|---|---|---|---|---|
| 4,833,678 A | * | 5/1989 | Cohen ........................ | 714/781 |
| 4,866,716 A | | 9/1989 | Weng | |
| 5,309,449 A | * | 5/1994 | Gandini et al. ............ | 714/781 |
| 5,321,704 A | * | 6/1994 | Erickson et al. ............ | 714/781 |
| 5,666,369 A | * | 9/1997 | Nakamura ................... | 714/781 |
| 5,771,244 A | * | 6/1998 | Reed et al. ................. | 714/781 |
| 5,974,582 A | * | 10/1999 | Ly ............................. | 708/492 |
| 5,983,389 A | | 11/1999 | Shimizu | |
| 6,031,875 A | | 2/2000 | Im | |
| 6,061,826 A | * | 5/2000 | Thirumoorthy et al. ..... | 714/784 |
| 6,192,497 B1 | * | 2/2001 | Yang et al. ................. | 714/781 |
| 6,279,137 B1 | * | 8/2001 | Poeppelman et al. ....... | 714/781 |

FOREIGN PATENT DOCUMENTS

| | | | | |
|---|---|---|---|---|
| JP | 403121627 A | * | 5/1991 | ................. 714/758 |

OTHER PUBLICATIONS

Ganapathy et al. << Designing a scalable processor array for recurrent computations; IEEE Transactions on Parallel and Distributed Systems, , vol. 8, Issue: 8, p. 840–856, Aug. 1997.*

Richard E. Blahut "A Theory and Practice of Error Control Codes", Addison–Wesley Publishing Company, Reading MA, table of contents, chapter 4 pp. 65–92, chapter 5, pp. 93–129, and chapter 8 pp. 207–247, 1983.

Peterson et al., "A Error–Correcting Codes, Second Edition", MIT Press, Cambridge, MA, London, England, table of contents, chapter 4 76–115, chapter 6 pp. 144–169, chapter 7 pp. 170–205, and chapter 8 pp. 206–265, 1972.

* cited by examiner

Primary Examiner—Albert Decady
Assistant Examiner—Guy Lamarre
(74) Attorney, Agent, or Firm—Daly, Crowley & Mofford, LLP

(57) ABSTRACT

A decoder for decoding block error correction codes is described. The decoder includes a first search circuit to find roots of an error location polynomial corresponding to an error location and a second search circuit to find roots of an error location polynomial corresponding to an error location. A multiplexer is fed by the first search circuit and the second search circuit to produce an error location from the error location polynomial.

60 Claims, 13 Drawing Sheets

Initial register values: $reg_i^{(l)}[0] = \alpha^{-il}\sigma_i$, $i = 0, 1, ..., k$, $l = 0, ..., u-1$

DECODER FOR ERROR CORRECTING BLOCK CODES

BACKGROUND

This invention relates to error correcting code techniques.

Error correcting code techniques are used in digital systems to correct and detect errors in digital data. Such techniques are particularly employed with magnetic disks which typically have relatively high rates of error due to manufacturing defects and so forth. Several types of error correcting techniques are known. One type of error correcting technique uses so-called "block codes." Two examples of block codes are the so called "Reed Solomon" (RS) code and "Bose-Chaudhuri-Hocquenghem" (BCH) code.

Block codes such as "Reed Solomon" and "Bose-Chaudhuri-Hocquenghem", operate on data symbols. Data symbols are vectors of binary bits of data. Symbols are generated by grouping bits at a particular bit position for a group of words into a vector. When block codes are used in a disk drive, before a string of data symbols are recorded on a disk, the string is mathematically encoded producing error correcting code symbols that are appended to the data symbols to form code words. These code words i.e., data symbols and error correcting code symbols are stored on the disk. When the stored data is retrieved from the disk, the code words are mathematically decoded to form decoded code words.

In order to correct errors, the locations and magnitudes or values of the errors are needed. A conventional approach for determining the location of such errors uses a decoder including a syndrome generator to form error syndromes. The error syndromes are used to generate an error location polynomial and the error location polynomial is used to determine an error location. The conventional approach uses a single Chien search circuit to search for roots of the error location polynomial. The Chien search circuit evaluates the error location polynomial for all possible error locators by iteratively evaluating the error location polynomial "n" times, where n is the code length. This is a time consuming process when n is large and the code rate is high.

The roots of the error location polynomial (i.e., when the error location polynomial is zero) correspond to the location of the errors in the code word. An error evaluation polynomial is evaluated to determine error values based on the determined error locations. Once the error locations and the corresponding error values are known, the data can be corrected.

SUMMARY

According to an aspect of the invention, a decoder for decoding block error correction codes includes a first search circuit to find roots of an error location polynomial corresponding to an error location and a second search circuit to find roots of an error location polynomial corresponding to an error location. A multiplexer is fed by the first search circuit and the second search circuit to produce an error location from the error location polynomial.

According to a further aspect of the invention, a decoder for decoding block codes includes a parallel error location polynomial search circuit. The parallel error location search circuit includes a first search circuit that finds roots of an error location polynomial that correspond to an error location. The circuit includes a first modulo adder circuit that adds odd terms of the error location polynomial to produce a derivative of the error location polynomial. The circuit also includes a second search circuit that finds roots of an error location polynomial that correspond to an error location. A second modulo adder circuit adds odd terms of the error location polynomial to produce a derivative of the error location polynomial. The circuit also includes a first multiplexer fed by error location outputs from the first search circuit and the second search circuit, a second multiplexer fed by derivatives of error location outputs from the first and the second modulo adders. The circuit also includes an error evaluation circuit that produces the error evaluator polynomial and a logic circuit including a divider circuit to divide the error evaluator polynomial by the output from the second multiplexer.

According to a still further aspect of the invention, a method of decoding an error correcting block code includes evaluating an error location polynomial produced from an error location polynomial generation circuit by applying the error location polynomial to a parallel root search circuit that searches for roots of the error location polynomial in a parallel manner.

One or more advantages are provided by the above aspects. The two-way parallel root search circuit searches for roots of the error location polynomial in a parallel manner. This saves substantial computation time to facilitate real time decoding of high rate Reed Solomon and BCH codes. For example, a two-way parallel root search circuit can use two duplicate root search circuits to reduce the search time to determine the roots of an error-locator polynomial by half. An additional advantage of the arrangement is that the parallel root search circuit can be modified to provide a term that can be used with an error evaluator without the need to compute a derivative of the error location polynomial.

DETAILED DESCRIPTION

Figure 1:
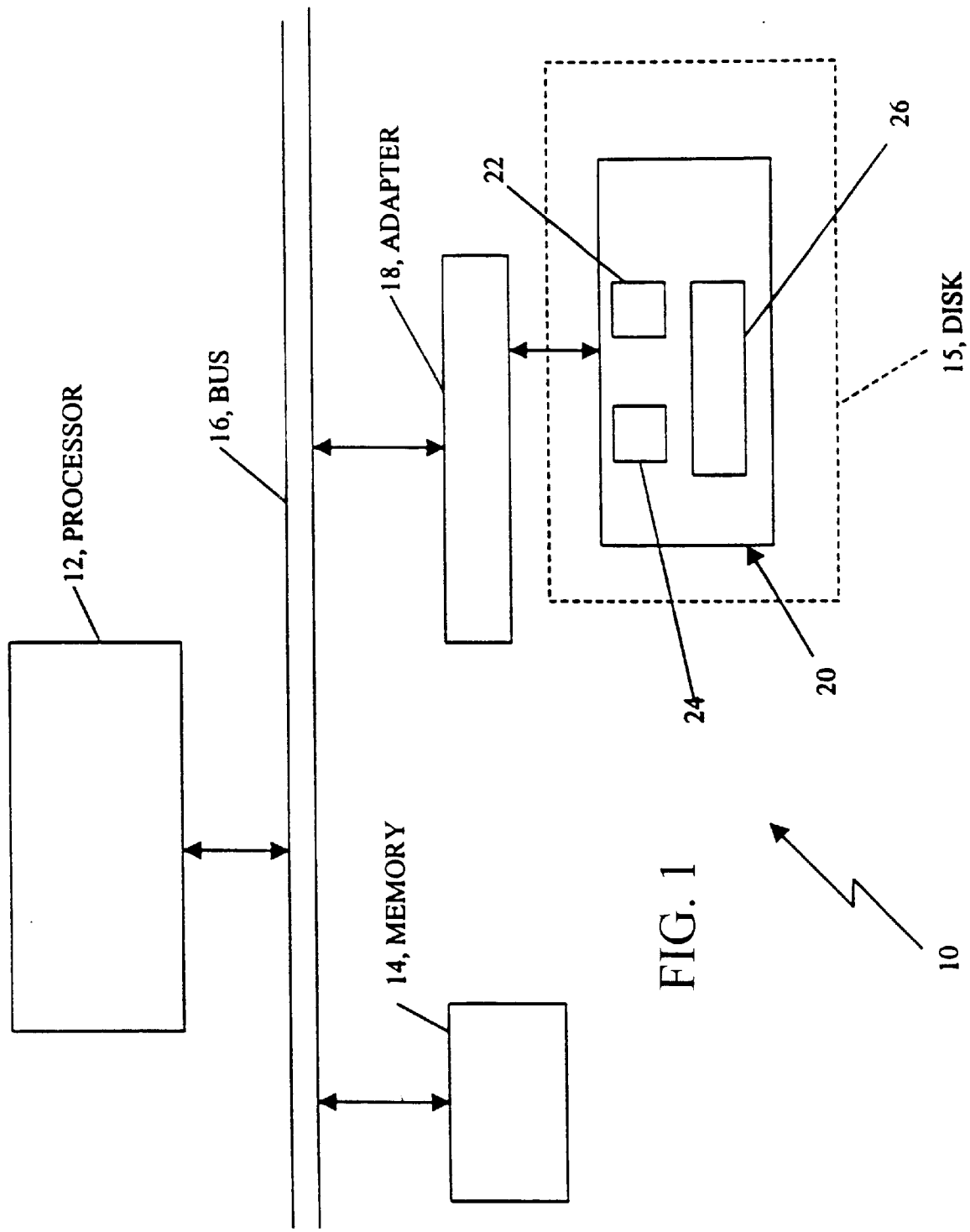
FIG. 1 is a block diagram of a computer including a storage device.

Referring now to FIG. 1, a computer system 10 includes a processor 12, a main memory 14 and a magnetic storage subsystem 15, all coupled via a computer bus 16. The magnetic storage system 15 includes a bus adapter 18, a storage bus 19 and a storage device 20. A preferred example of the storage device 20 is a magnetic disk. Other examples include a magnetic tape drive and a solid state disk.

The storage device 20 includes an error correcting code symbol generator 22 and an error correction circuit 24, as well as, a disk drive 26.

Figure 2:
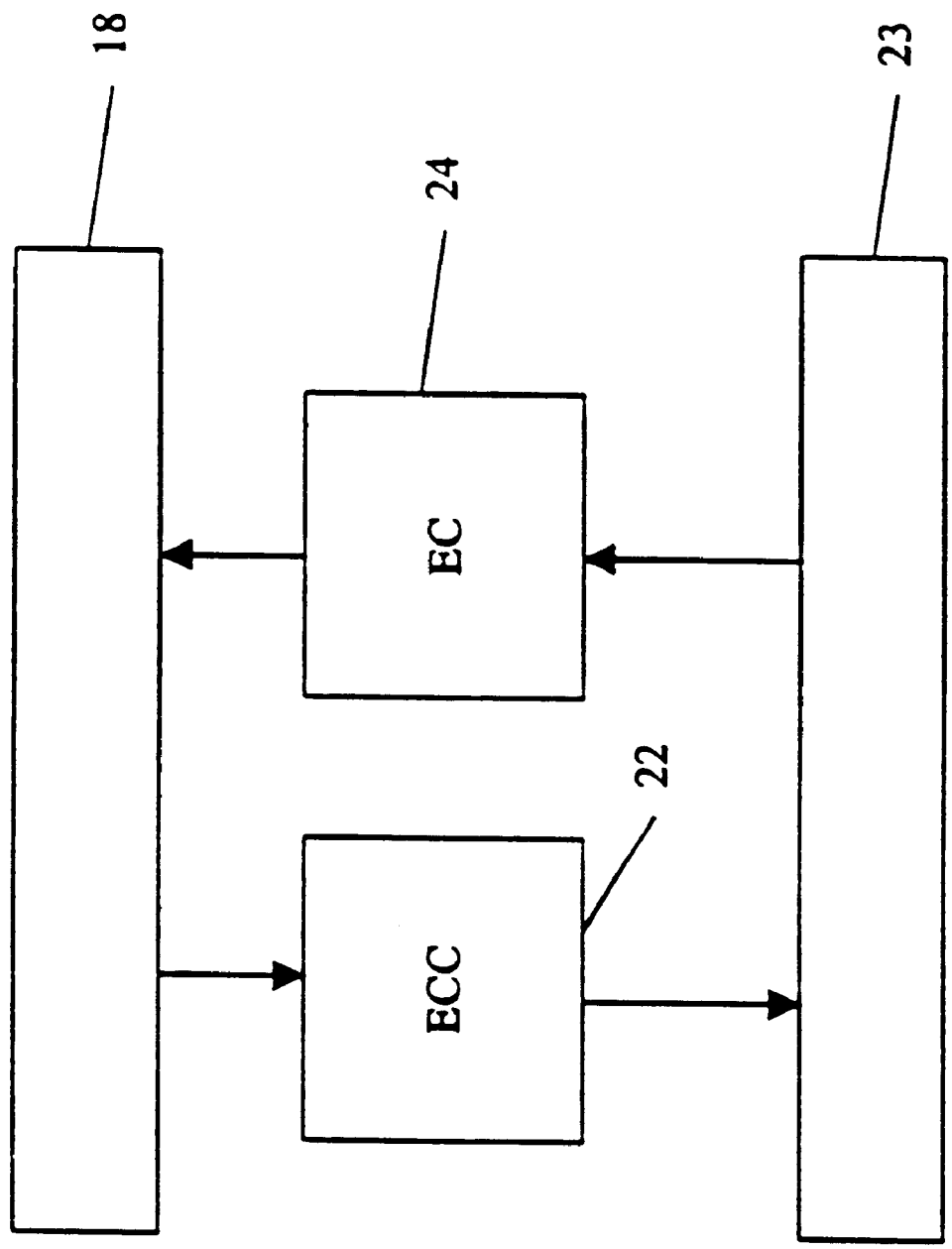
FIG. 2 is a block diagram of an error correction apparatus for the storage device of FIG. 1.

Referring now to FIG. 2, a portion of the storage device 20 is shown including the error correcting code generator 22. The error correcting code generator 22 is fed input data from the bus adapter 18 and generates error correcting code symbols. During a write to disk operation, the error correcting code symbols are concatenated with data symbols and fed to a disk interface 23 for storage on the disk drive 26 (FIG. 1). During a read from disk operation, the data from the disk 26 are fed to the disk interface 23 and to an error correction circuit (EC) 24. The EC circuit 24 uses a parallel decoding technique in order to correct the errors. The EC circuit 24 corrects such errors providing they do not exceed the capability of the EC circuit 24.

Figure 3:
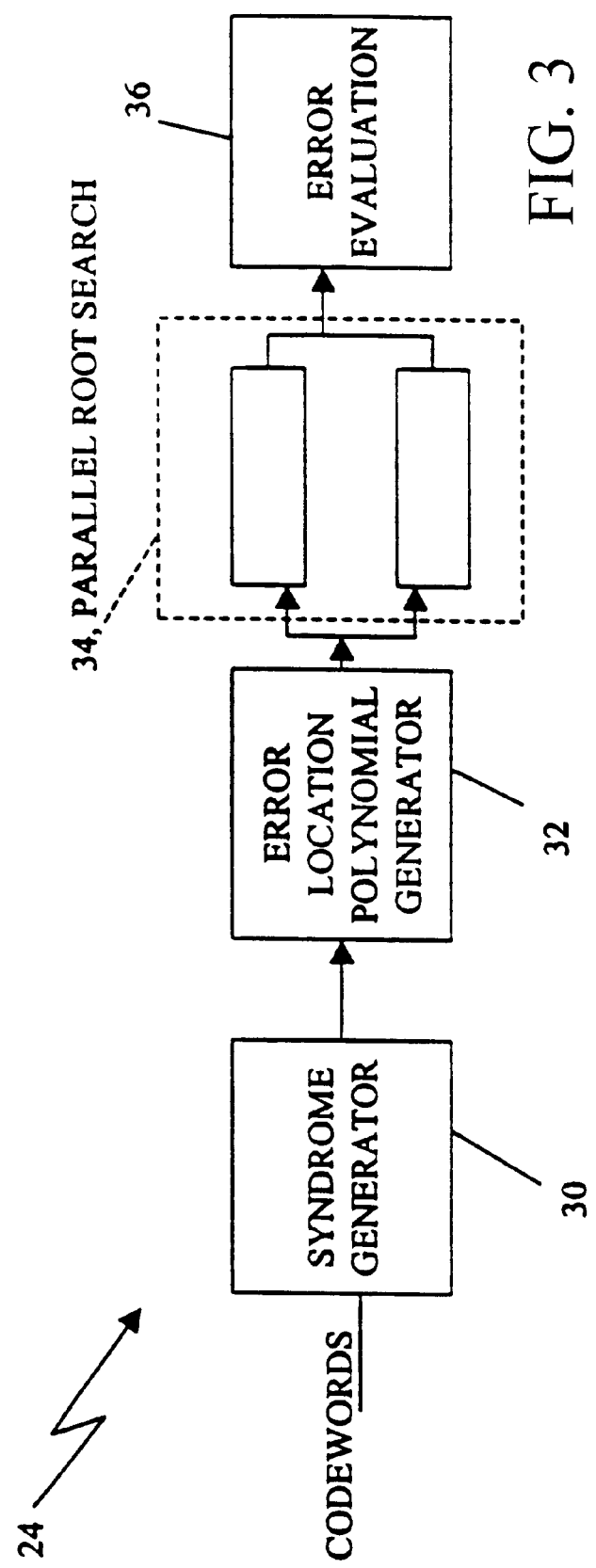
FIG. 3 is a block diagram of an error correction detection circuit.

Referring now to FIG. 3, details of the error correction circuit 24 are shown. A syndrome generator 30 produces error syndromes from results of "exclusive ORing" retrieved error correcting code symbols in a conventional manner. The syndromes are fed to an error location polynomial circuit 32 to produce an error locator polynomial σ. The roots of the error location polynomial are determined in a two-way, parallel root search circuit 34. The roots of the error location polynomial, if any, correspond to the error locations, if any, in the codewords. The evaluator circuit 36 evaluates the errors at the locations identified by the parallel root search circuit 34. As will be described below, optionally, the error evaluator and root search circuits can share circuits.

The two-way parallel root search circuit 34 searches for roots of the error location polynomial σ in a parallel manner. This saves substantial computation time to facilitate real time decoding of high rate Reed Solomon and BCH codes. The two-way parallel root search circuit 34 implements a variation of the so-called "Chien" search algorithm.

A Chien search algorithm evaluates an error location polynomial using Galois field (GF) arithmetic. Considering an m bit symbol of a Reed Solomon code of length $2^m-1$, such a symbol can be considered to be an element "α" defined in the Galois field $GF(2^m)$. If α is a primitive element of the Galois field $GF(2^m)$ then the possible error locations in the multi-bit symbol are in the set of $\{1, \alpha, \ldots \alpha^{n-1}\}$. The value α is a primitive element if α can generate all of the values of the field except 0. If σ(x) is an error location polynomial that contains k error locations, namely, $\alpha^{r1}, \alpha^{r2}, \ldots \alpha^{rk-1}$ and $\alpha^{rk}$ then $$\sigma(\chi)=(\alpha^{r1}\chi-1)(\alpha^{r2}\chi-1)\ldots(\alpha^{rk-1}\chi-1)(\alpha^{rk}\chi-1)=\sigma_k\chi^k+\sigma_{k-1}\chi^{k-1}+\ldots+\sigma_1\chi+\sigma_0$$

The error locations $\alpha^{\alpha j}$ are found from the given coefficients $\sigma_i$, i=0, ..., k. The simplest way to find an error-location from σ(χ) is by trial and error, i.e., by evaluating σ(χ) for all possible values i.e., $\chi \in \{1, \alpha^{-1}, \ldots, \alpha^{-(n-1)}\}$, where $\sigma(\alpha^{-1})=0$, $\alpha^{-1}$ corresponds to an error location. The Chien search is an implementation of this trial and error method in an orderly manner.

Consider the evaluation of σ(χ) with $\alpha^{-j}$ for j≧0. Every possible value of $\alpha^{-j}$ is evaluated as:

$$\sigma(\alpha^{-j})=\sigma_k\alpha^{-kj}+\sigma_{k-1}\alpha^{-(k-1)j}+\ldots+\sigma_1\alpha^{-j}+\sigma_0$$

The order of trials can be either in ascending order or in descending order of j. For an ascending order search, the expression $\sigma(\alpha^{-j})$ is evaluated to find error locations by iterating from 0 to n−1. Given a bank of registers $reg_k(j)$ to $reg_0(j)$, and denoting $reg_i(j)=\sigma_i\alpha^{-ij}$ provides $$\sigma(\alpha^{-j})=reg_k(j)+reg_{k-1}(j)+\ldots+reg_1(j)+reg_0(j)$$

where $reg_i(j)$ can be considered as the i-th register value in registers $reg_k(j)$ to $reg_0(j)$ at iteration cycle j. $Reg_i(j)$ can be obtained iteratively from the value of the same register in the previous iteration cycle, i.e., $$reg_i(j)=\alpha^{-i}reg_i(j-1) \text{ for } j \geq 1$$

The initial values of these registers are:

$$reg_i(0)=\sigma_i \text{ for } i=0, \ldots k$$

A Chien search can also be performed in a descending order. For a descending order search the expression a is iteratively evaluated from n−1 to 0.

The error location polynomial evaluated from n−1 to 0 can be expressed as:

$$\sigma(\alpha^{-(n-1-j)})=\sigma_k\alpha^{-k(n-1-j)}+\sigma_{k-1}\alpha^{-(k-1)(n-1-j)}+\ldots+\sigma_1\alpha^{-n-1-j}+\sigma_0$$

By defining $$reg_i(j)=\sigma_i\alpha^{-i(n-1-j)}=(\alpha^{i(1-n)}\sigma_i)\alpha^{ij}$$

we have $$\sigma(\alpha^{-(n-1-j)})=reg_k(j)+reg_{k-1}(j)+\ldots+reg_1(j)+reg_0(j)$$

where the initial value of the register $reg_i$ is $$reg_i(0)=\alpha^{i(1-n)}\sigma_i$$

and the iterative relation is $$reg_i(j)=\alpha^i reg_i(j-1) \text{ for } j \geq 1$$

An "n" number of iterations are performed to evaluate the error location polynomial, where n is the code length. When n is large, the number of the iterations may be too large for real-time hardware decoding.

Figure 4:
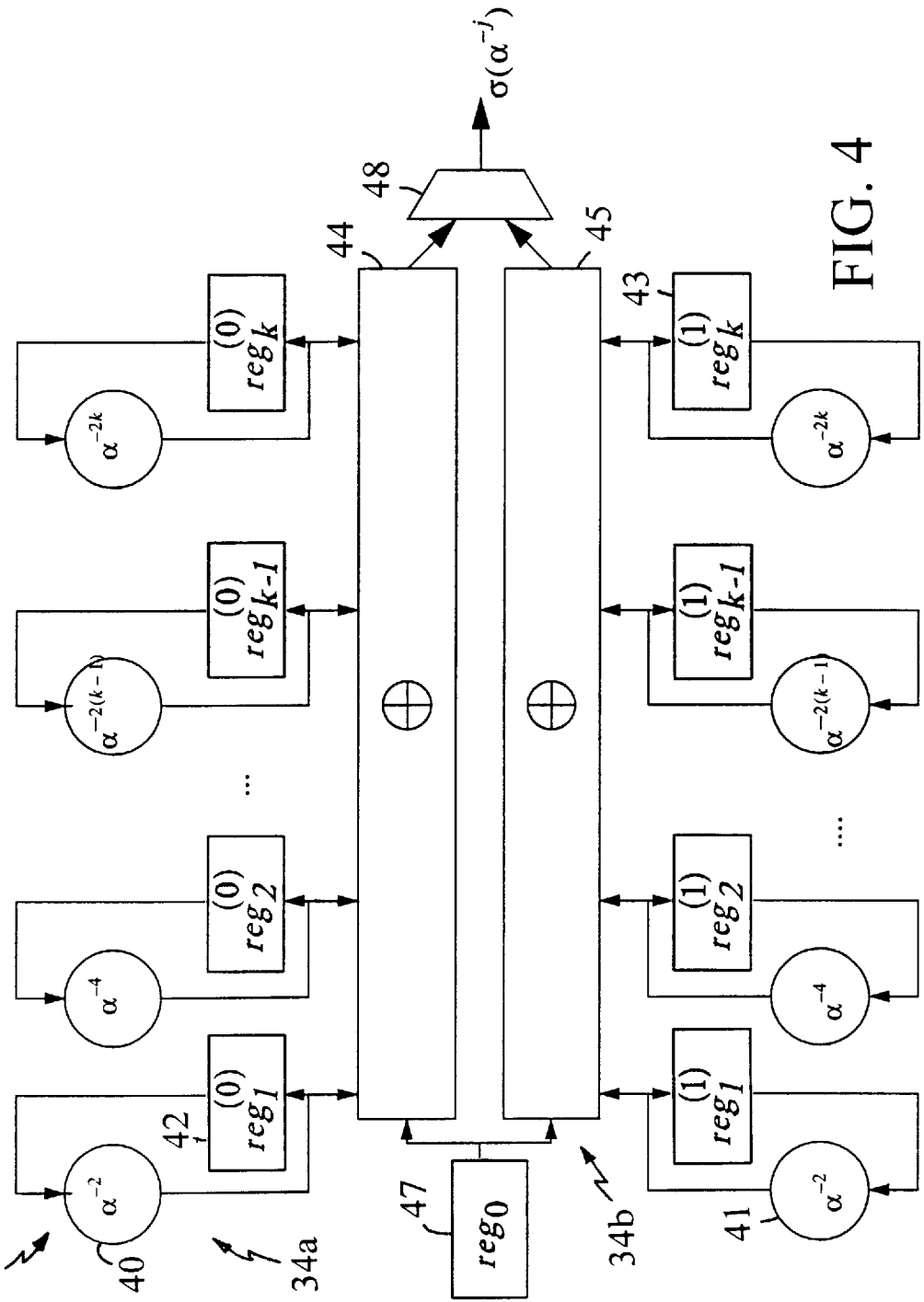
FIGS. 4 and 5 are block diagrams of parallel error search circuits.

Referring now to FIG. 4, the two-way parallel root search circuit 34 is shown. The two-way parallel search circuit 34 includes a first search circuit 34a comprised of a series of multipliers 40 and a first bank of registers 42 that feed results on an iterative basis to a bank of "exclusive OR" gates 44. The banks of exclusive OR gates 44 and 45 are fed by register 0 REG (0) 47. The bank of exclusive or gates 44 "exclusive OR's" (i.e., adds modulo 2) the outputs of register 47 and the register bank 42.

The two-way parallel root search circuit 34 includes a second search circuit 34b comprised of multipliers 41 and a second bank register 43 that also evaluate the error polynomial on an iterative basis. The outputs of the second bank of registers 43 are coupled to a second bank of exclusive OR gates 45 to evaluate the results from the second bank of registers 43.

The output of exclusive OR gate banks 44 and 45 are fed to a multiplexer 48 that is controlled by a select signal (not shown) that alternately selects one of the search circuits 34a, 34b, as an output each cycle of the decoder 34. When the multiplexer 48 outputs a logic zero, this corresponds to a root of the error location polynomial.

The two-way parallel root search circuit 34 reduces the number of search iterations and, as a consequence, the amount of search time, needed to find the roots of the error location polynomial. The two-way parallel search circuit uses a pair of chains each chain having different initial values and multiplier coefficients. The initial values for each chain are derived as follows:

Let v be any integer such that 0≦v≦n−1, then $$v=2j+l$$

with l=0 or 1 and 0≦j≦(n−1)/2.

For a two-way parallel root search from 0 to n−1, $\sigma(\alpha^{-v})$ the $v^{th}$ root of the error location polynomial is given by:

$$\sigma(\alpha^{-v}) = \sigma_k \alpha^{-k(2j+1)} + \sigma_{k-1}\alpha^{-(k-1)(2j+1)} + \ldots + \sigma_1 \alpha^{-(2j+1)} + \sigma_0$$

$$= (\alpha^{-ik}\sigma_k)\alpha^{-2kj} + (\alpha^{-i(k-1)}\sigma_{k-1})\alpha^{-2(k-1)j} + \ldots +$$

$$(\alpha^{-i}\sigma_1)\alpha^{-2j} + \sigma_0$$

$$= \sum_{i=0}^{k} (\alpha^{-il}\sigma_i)\alpha^{-2ij}$$

by defining $$\text{reg}_i^{(0)}(j) = \sigma_i\alpha^{-(2i)j} \text{ and } \text{reg}_i^{(1)}(j) = (\alpha^{-i}\sigma_i)\alpha^{-(2i)j}$$

σ can be expressed in two different chains and is given, as in Equations 1 and 2:

$$\sigma(\alpha^{-(2j)}) = \text{reg}_k^{(0)}(j) + \text{reg}_{k-1}^{(0)}(j) + \ldots + \text{reg}_1^{(0)}(j) + \text{reg}_0^{(0)}(j) \quad \text{(Equation 1)}$$

and $$\sigma(\alpha^{-(2j+1)}) = \text{reg}_k^{(1)}(j) + \text{reg}_{k-1}^{(1)}(j) + \ldots + \text{reg}_1^{(1)}(j) + \text{reg}_0^{(1)}(j) \quad \text{(Equation 2)}$$

for $0 \leq j \leq (n-1)/2$. Moreover, the values of the registers 42 ($\text{reg}_i^{(0)}$) 42 and registers 43 ($\text{reg}_i^{(1)}$) have the same iterative relations for $0 \leq j \leq (n-1)/2$, as given in equations 3 and 4.

$$\text{reg}_i^{(0)}(j) = \alpha^{-2i}\text{reg}_i^{(0)}(j-1) \quad \text{(Equation 3)}$$

$$\text{reg}_i^{(1)}(j) = \alpha^{-2i}\text{reg}_i^{(1)}(j-1) \quad \text{(Equation 4)}$$

The initial values of these two banks 42, 43 of registers are:

register 42 $\text{reg}_i^{(0)}(0) = \sigma_i$ and
register 43 $\text{reg}_i^{(1)}(0) = \alpha^{-i}\sigma_i$ The values of $\text{reg}_i^{(0)}(j)$ and $\text{reg}_i^{(1)}(j)$ can be computed independently. The two-way parallel root search circuit 34 uses two duplicate root search circuits 34a, 34b which have different initial values in registers 42, 43. This parallel circuit 34 reduces the search time to determine the roots of the error-locator polynomial by half. The initial values of $\text{reg}_i^{(0)}$ registers 42 are provided by the error-locator polynomial coefficients $\sigma_i$, whereas an initializer 50 converts the initial values of $\text{reg}_i^{(0)}$ registers 43 to those of $\text{reg}_i^{(1)}$. The initializer 50 is described in conjunction with FIG. 12. The initial values for the registers are given in TABLE 1:

TABLE 1

| i | k | k − 1 | ... | 2 | 1 | 0 |
|---|---|---|---|---|---|---|
| $\text{reg}_i^{(0)}[0]$ | $\sigma_k$ | $\sigma_{k-1}$ | | $\sigma_2$ | $\sigma_1$ | $\sigma_0$ |
| $\text{reg}_i^{(1)}[0]$ | $\alpha^{-k}\sigma_k$ | $\alpha^{-(k-1)}\sigma_{k-1}$ | | $\alpha^{-2}\sigma_2$ | $\alpha^{-1}\sigma_1$ | $\sigma_0$ |

Figure 5:
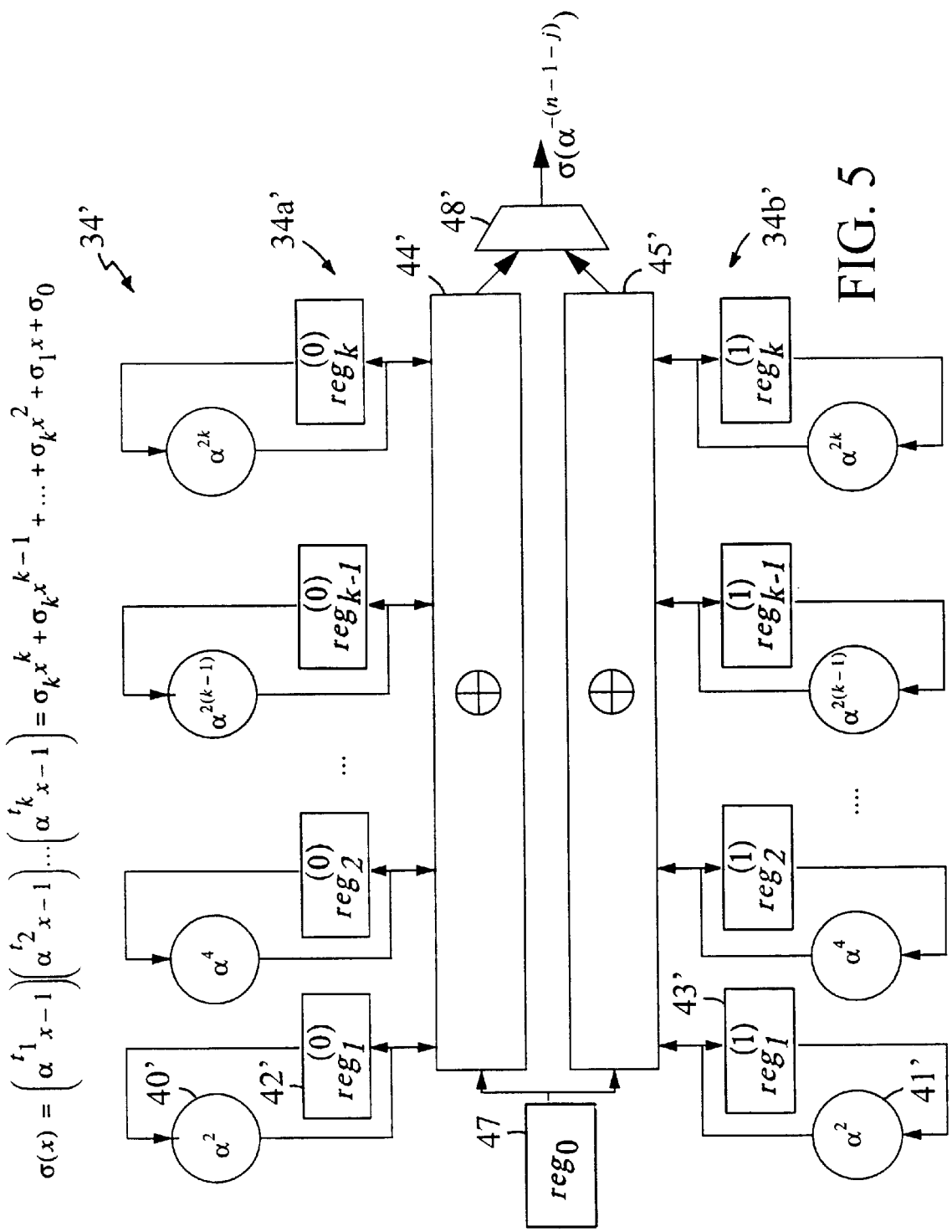

Referring now to FIG. 5, a parallel two-way root search circuit 34' that searches from n−1 to 0 is illustrated. The circuit 34' has a similar structure to circuit 34. Circuit 34' therefore includes a first search circuit 34a' including multipliers 40', registers 42', an "exclusive OR" bank 44, and a second search circuit 34b' including multipliers 41', registers 43' and an "exclusive OR" bank 45'. The search circuit 34' includes a register (0) 47' and a multiplexer 48'. Multiplexer 48' is controlled by a select signal (not shown) that alternately selects one of the search circuits 34a, 34b, as an output for each cycle of the decoder 34'. Circuit 34' differs from circuit 34 (FIG. 4) in that the coefficients used to multiply the contents of registers are different and the initial values in registers 42', 43' are also different, as illustrated in the accompanying TABLE 2.

TABLE 2

| i | k | k − 1 | ... | 2 | 1 | 0 |
|---|---|---|---|---|---|---|
| $\text{reg}_i^{(0)}[0]$ | $\alpha^{k(1-n)}\sigma_k$ | $\alpha^{(k-1)(1-n)}\sigma_{k-1}$ | | $\alpha^{2(-n)}\sigma_2$ | $\alpha^{1-n}\sigma_1$ | $\sigma_0$ |
| $\text{reg}_i^{(1)}[0]$ | $\alpha^{k(2-n)}\sigma_k$ | $\alpha^{(k-1)(2-n)}\sigma_{k-1}$ | | $\alpha^{2(1-n)}\sigma_2$ | $\alpha^{2-n}\sigma_1$ | $\sigma_0$ |

The two-way parallel root search 34' from n−1 to 0 can be explained, as follows. For circuit 34', the initial values of the two sets of registers 42', 43' $\text{reg}_i^{(0)}$ and $\text{reg}_i^{(1)}$ are:

$$\text{reg}_i^{(0)}(0) = \alpha^{(1-n)i}\sigma_i \text{ and } \text{reg}_i^{(1)}(0) = \alpha^{(2-n)i}\sigma_i$$

and the iteration relations are:

$$\text{reg}_i^{(l)}(j) = \alpha^{2i}$$

$$\text{reg}_i^{(l)}(j-1)$$

for $0 \leq j \leq (n-1)/2$. The error location polynomial σ is given by equation 5:

$$\sigma(\alpha^{-(n-2j-l)}) = \text{reg}_k^{(l)}(j) + \text{reg}_{k-1}^{(l)}(j) + \ldots + \text{reg}_1^{(l)}(j) + \text{reg}_0^{(l)}(j) \quad \text{(Equation 5)}$$

for $0 \leq j \leq (n-1)/2$, where l=0 and 1.

Figure 6:
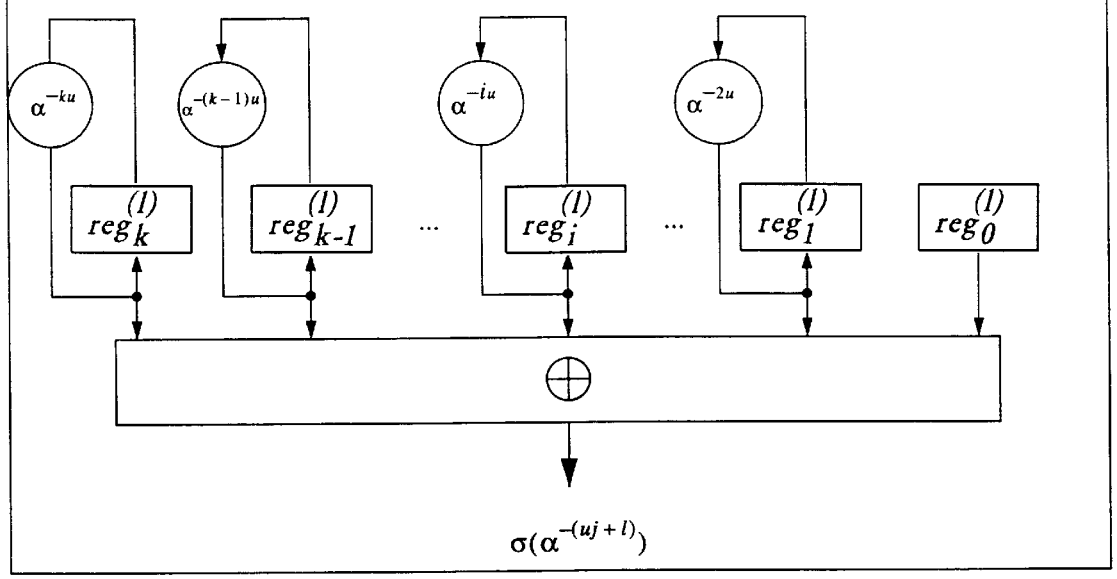
FIGS. 6 and 7 are block diagrams of multi-way error search circuits.
Figure 6:
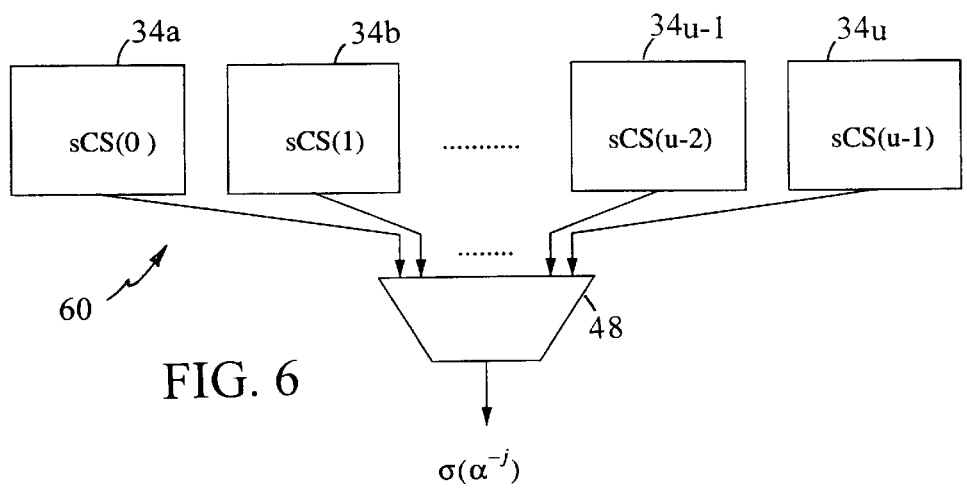
Figure 7:
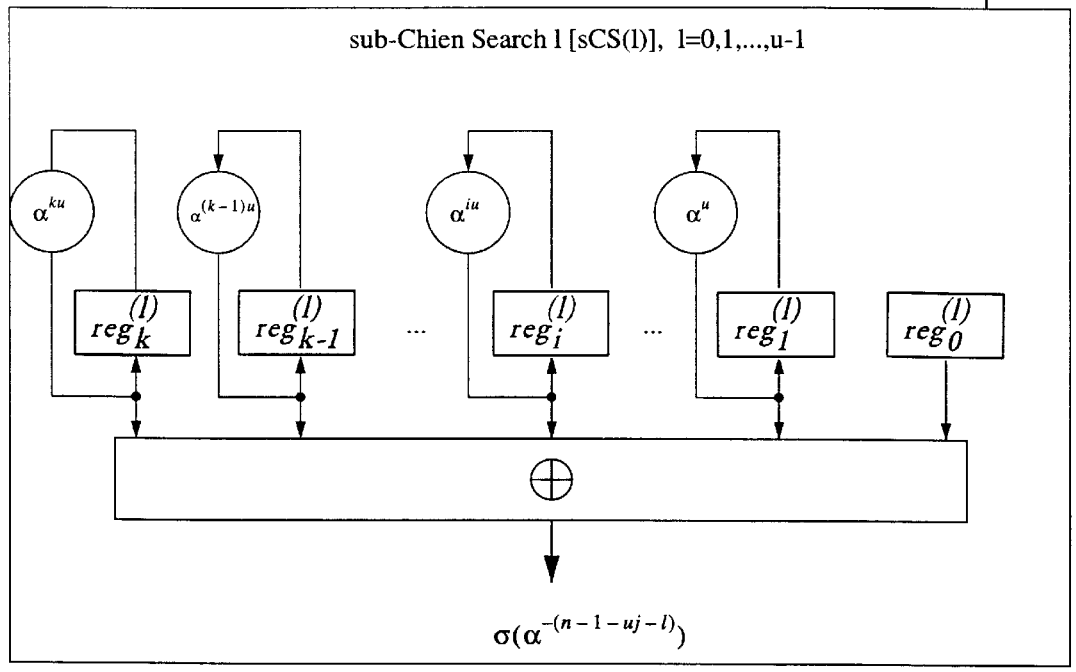
Figure 7:
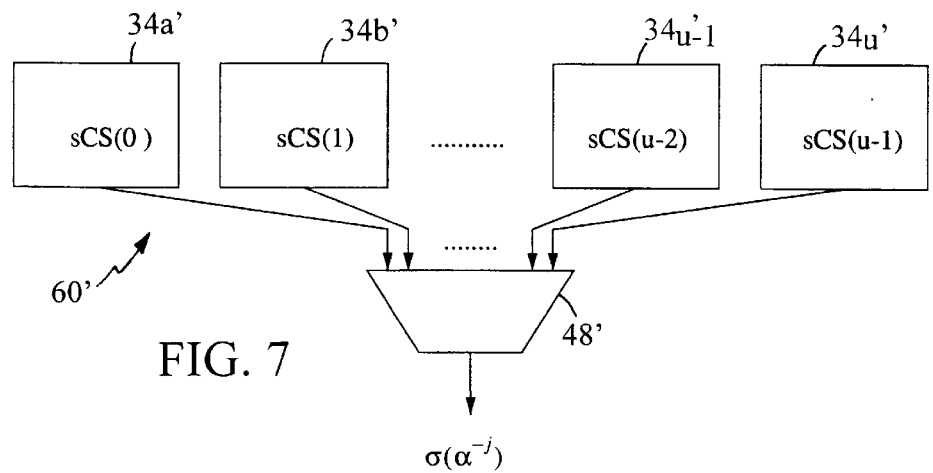

Referring now to FIGS. 6 and 7, generalized U-way parallel root search circuits 60 and 60' are shown for search directions 0 to n−1 60 (FIG. 6) and for n−1 to 0 60' (FIG. 7), respectively. As shown in FIG. 6, the U-way parallel search circuit 60 includes a plurality of (U number of) root search circuits $34_0$–$34_{u-1}$, each evaluating one of the iterations for n and each comprising a plurality of registers/multiplier combinations. Each one of the search circuits 34a–34u includes a bank of "exclusive OR" gates, as generally shown for bank 34a or 34a', respectively. The outputs of the root search circuits $34_0$–$34_{u-1}$ are fed to a multiplexer 49 that is controlled by a select signal (not shown) that alternately selects one of the inputs as an output each cycle of the decoder. When the multiplexer 49 outputs a logic zero, this corresponds to a root of the error location polynomial.

The generalized U-way search circuit can be explained as follows: If u is a positive integer, then for any integer v where $0 \leq v \leq n-1$, $$v = uj + l$$

with $l \in \{0, 1, \ldots, u-1\}$ and $0 \leq j \leq (n-1)/u$. The error location polynomial is given by:

$$\sigma(\alpha^{-v}) = \sigma_k \alpha^{-k(uj+l)} + \sigma_{k-1}\alpha^{-(k-1)(uj+l)} + \ldots + \sigma_1\alpha^{-(uj+l)} + \sigma_0$$

$$= \sum_{i=0}^{k} \alpha^{-il}\sigma_i \alpha^{-iuj}$$

A U-way parallel root search from 0 to n−1 also can be provided. For branches l=0, ..., u−1, registers $\text{reg}_i^{(l)}$ can be defined with the initial values, as given in equation 6.

$$\text{reg}_i^{(l)}(0) = \alpha^{-il}\sigma_i \quad \text{(Equation 6)}$$

The iterative relation for the registers is given by equation 7 as:

$$\text{reg}_i^{(l)}(j) = \alpha^{-iu}\text{reg}_i^{(l)}(j-1), \quad 0 \leq j \leq (n-1)/u \quad \text{(Equation 7)}$$

Thus, for branches l=0,1, ..., u−1, the error location polynomial is given by equation 8 as:

$$\sigma(\alpha^{-(uj+l)}) = \text{reg}_k^{(l)}(j) + \text{reg}_{k-1}^{(l)}(j) + \ldots + \text{reg}_1^{(l)}(j) + \text{reg}_0^{(l)}(j) \quad \text{(Equation 8)}$$

with $0 \leq j \leq (n-1)/u$.

Referring now to FIG. 7, a u-way parallel Chien search from n−1 down to 0 can be provided based on the teachings set out above.

For the branches l=0, ..., u−1, registers $\text{reg}_i^{(l)}$ can be defined with the initial values, as given in equation 9.

$$\text{reg}_i^{(l)}(0) = \alpha^{(l+1-n)i}\sigma_i \quad \text{(Equation 9)}$$

The iterative relation is thus given by equation 10 as:

$$\text{reg}_i^{(l)}(j) = \alpha^{iu}\text{reg}_i^{(l)}(j-1), \ 0 \leq j \leq (n-1)/u. \quad \text{(Equation 10)}$$

Then, for branches l=0,1, ..., u−1, the error location polynomial is given by equation 11 as:

$$\sigma(\alpha^{-(n-uj-l)}) = \text{reg}_k^{(l)}(j) + \text{reg}_{k-1}^{(l)}(j) + \ldots + \text{reg}_1^{(l)}(j) + \text{reg}_0^{(l)}(j) \quad \text{(Equation 11)}$$

with $0 \leq j \leq (n-1)/2$.

The u registers values $\text{reg}_i^{(0)}(j), \text{reg}_i^{(1)}(j), \ldots, \text{reg}_i^{(u-1)}(j)$ can be updated in parallel. Therefore, at the same clock cycle, u results $$\sigma(\alpha^{-uj}), \sigma(\alpha^{-(uj+1)}), \ldots, \sigma(\alpha^{-(uj+u-1)})$$

can be obtained. Based on equation 11, a u-way parallel root search circuit 60 can have u number of root search circuits $34_0$–$34_{u-1}$ having u different sets of initial values. This circuit 60 can search from 0 to n−1 (FIG. 6) and n−1 to 0 (FIG. 7) depending on the initial values and coefficients. As mentioned above, the initializer 20 is provided to convert the initial values $\sigma_i$ of $\text{reg}_i^{(0)}$ to those of $\text{reg}_i^{(l)}$ for $1 \leq l$.

Figure 8:
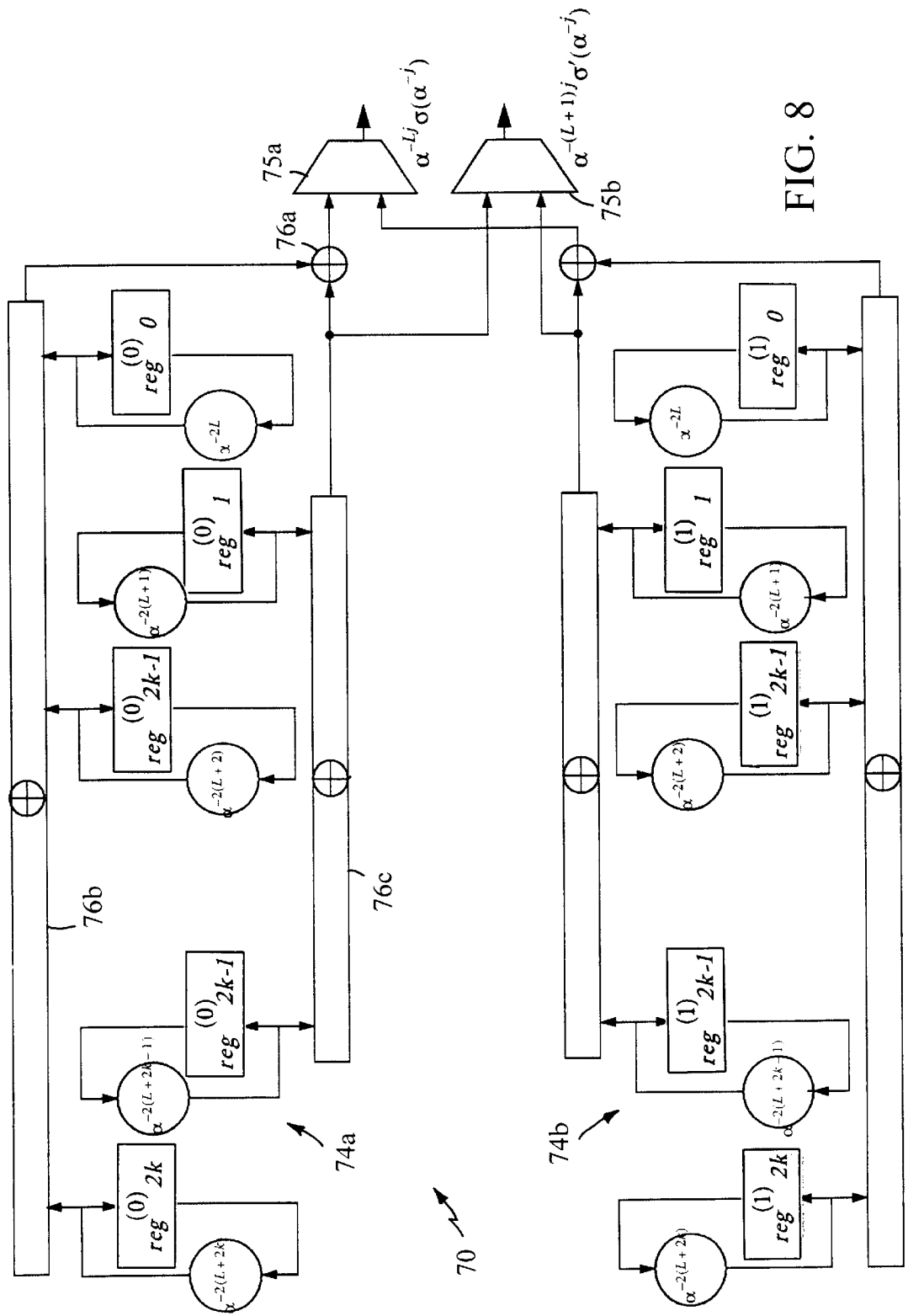
FIGS. 8 and 9 are block diagrams of parallel search circuits and error evaluator circuits.

Referring now to FIG. 8, a portion of a two-way parallel shared search and evaluator circuit 70 is shown. The two-way parallel search and evaluator circuit 70 includes a first root search circuit 74a SCF(0) and a second root search circuit 74b SCF(1) with associated multiplexers 75a–75b. From the outputs of the multiplexers 75a–75b are provided $\alpha^{-jL}\sigma(\alpha^{-j})$ and $\alpha^{-j(L+1)}\sigma'(\alpha^{-j})$. The term $\alpha^{-j(L+1)}\sigma'(\alpha^{-j})$ is one of the terms used to implement the Forney formula for error evaluation, as is described below. The value "L" is the leading exponent of consecutive roots of the Read-Solomon code.

The error location circuits 74a and 74b include registers and multipliers and three banks 76a–76c of "exclusive or" gates. The derivative of the error evaluation polynomial is provided from bank 76c whereas, the error location polynomial is provided from banks 76b and 76a of "exclusive or" gates, as shown.

Each root search circuit 74a, 74b is a shared circuit that provides an error polynomial root search result and the derivative of the error-location polynomial. The derivative of the error location polynomial is provided by considering that an error-correction m-bit symbol RS code of length n can be generated by:

$$g(\chi) = (\chi - \alpha^L)(\chi - \alpha^{L+1}) \ldots (\chi - \alpha^{L+2t-1})$$

If the redundancy symbols of the code are located in positions 0, 1, ... 2t−1, then when a corrupt word $r = r_0, \ldots, r_{n-1}$ is received, the decoder 70 will first compute the syndromes by $$S_i = \sum_{j=0}^{n-1} r_j \alpha^{(L+1)j}, \quad i = 0, \ldots, 2t-1$$

From these syndromes, an error-locator polynomial $\sigma(\chi)$ can be obtained by using a decoding algorithm, such as Berlekamp-Massey algorithm or Euclidean algorithm. The error evaluator polynomial $\omega(\chi)$ can be computed by:

$$\omega(\chi) = \sigma(\chi)S(\chi) \bmod \chi^{2t}$$

where $$S(\chi) = \sum_{i=0}^{2t-1} S_i \chi^i.$$

After obtaining the error location j from the error-locator polynomial $\sigma(\chi)$ by the root search, the associated error values can be computed by the Forney formula $$e_j = \frac{\omega(\alpha^{-j})}{\alpha^{-j(L+1)}\sigma'(\alpha^{-j})} \quad \text{Equation 12}$$

where $\sigma'(\chi)$ is the derivative of $\sigma(\chi)$. Additional detail concerning the above discussion can be found in "Theory and Practice of Error Control Codes" by Blahert, Addison-Wesley Publishing Company, 1983.

To implement the Forney formula, two values are needed $\omega(\alpha^{-j})$ and $\alpha^{-j(L+1)}\sigma'(\alpha^{-j})$. The value $\alpha^{-j(L+1)}\sigma'(\alpha^{-j})$ can be produced from the root search circuits 74a, 74b. Since $$\sigma'(\chi) = \sum_{i=0}^{k} i\sigma_i \chi^{i-1}$$

and the code is over $GF(2^m)$, we have $$\alpha^{-j(L+1)}\sigma'(\alpha^{-j}) = \alpha^{(-j(L+1))} \sum_{i \text{ is odd}} \sigma_i(\alpha^{-j})^{i-1}$$

$$= \sum_{i \text{ is odd}} \sigma_i \alpha^{-(L+i)j}$$

Recalling that the standard root (i.e., Chien) search technique is given by $$\text{reg}_i(j) = \sigma_i \alpha^{-(L+i)j}$$

for i=0,1, ..., k and j=0,1, ..., n−1.

The Chien search circuit can also be used to determine the derivative of the error location polynomial for use in an error evaluation circuit. The outputs from the root search circuit are given by Equation 13:

$$\alpha^{-jL}\sigma(\alpha^{-j}) = \sum_{i=0}^{k} \text{reg}_i(j) \quad \text{Equation 13}$$

and equation 14 gives the outputs of the root search circuit that provide the term for the error evaluator $$\alpha^{-j(L+1)}\sigma'(\alpha^{-j}) = \sum_{i \text{ is odd}} reg_i(j) \quad \text{Equation 14}$$

for $0 \leq j \leq n-1$. By initializing the register $reg_i$ to $reg_i(0)=\sigma_i$, the register $reg_i$ has the following iterative relation $$reg_i(j)=\alpha^{-(L+i)}reg_i(j-1)$$

for $1 \leq j \leq n-1$. Since $\alpha^{-jL}\sigma(\alpha^{-j})=0$ if and only if $\sigma(\alpha^{-j})=0$, $\chi^L\sigma(\chi)$ can also be used to find error-locations. Therefore, according to the above equations 13 and 14, by slightly modifying the root search circuits, the function of finding error-locations and calculation of $\alpha^{-jL+1}\sigma'(\alpha^{-j})$ can share the same circuit. The modification of the root search circuits involve generating a bank of exclusive OR gates to form the modulo sum terms corresponding to odd elements, to provide the derivative of the error location polynomial. Also, by initializing $$reg_i(0)=\alpha^{(L+i)(1-n)}\sigma_i$$

and defining the iteration relationship $$reg_i(j)=\alpha^{(L+i)}reg_i(j-1)$$

provides $$\alpha^{-(n-1-j)L}\sigma(\alpha^{-(n-1-j)}) = \sum_{i=0}^{k} reg_i(j)$$

and $$\alpha^{-(n-1-j)(L+1)}\sigma'(\alpha^{-(n-1-j)}) = \sum_{i \text{ is odd}} reg_i(j)$$

for $0 \leq j \leq n-1$. In addition, as shown in FIG. 9, a shared, parallel root search circuit 70' can be provided in the descending order from n-1 to 0.

Figure 9:
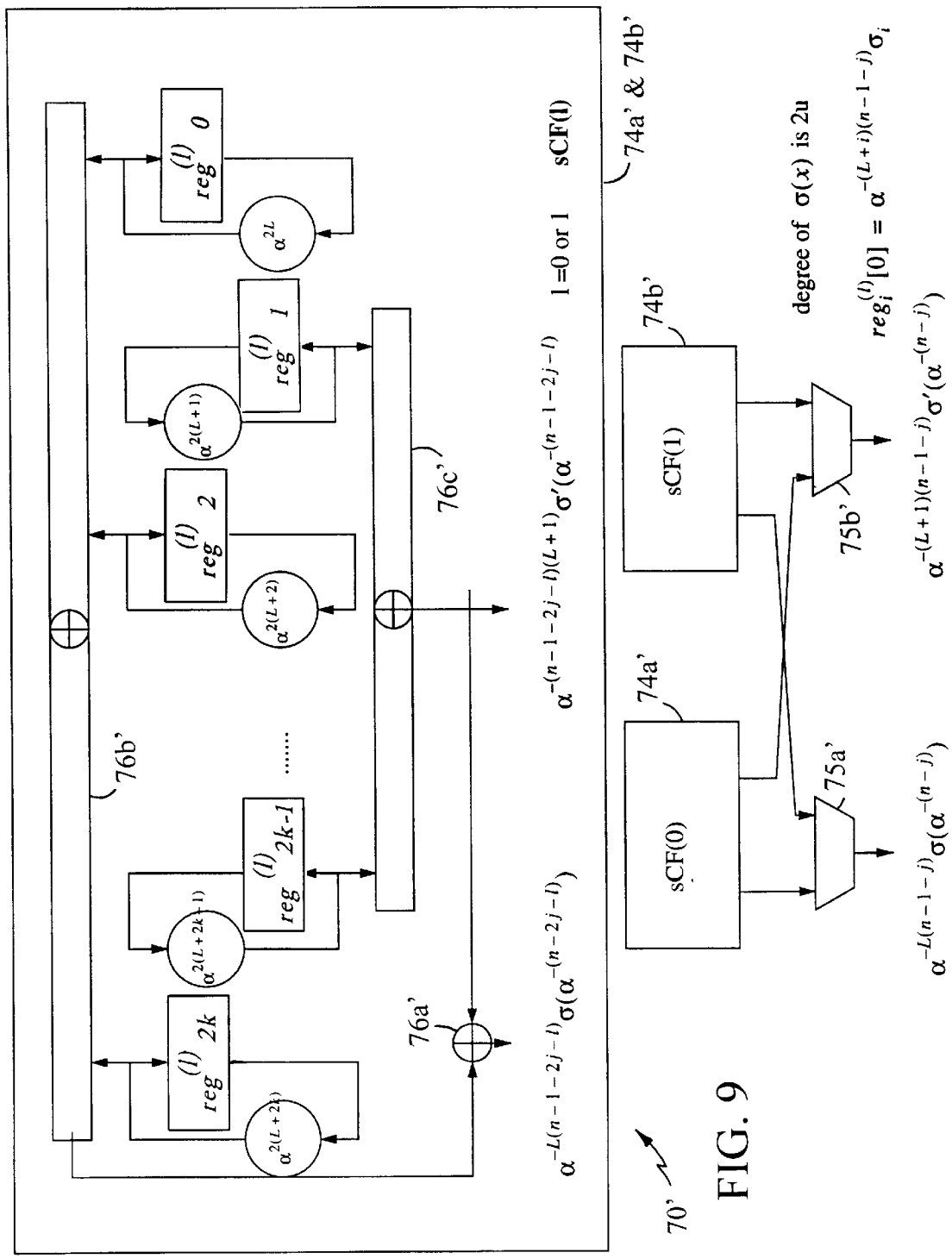

Referring now to FIG. 9, a portion of a two-way parallel shared search and evaluator circuit 70' is shown. The two-way parallel search and evaluator circuit 70' includes a first root search circuit 74a' SCF(0) and a second root search circuit 74b' SCF(1) with associated multiplexers 75a'–75b'. From the outputs of the multiplexers 75a–75b are provided $\alpha^{-L(n-1-j)}\sigma(\alpha^{-(n-j)})$ and $\alpha^{-(L+1)(n-1-j)}\sigma'(\alpha^{-(n-j)})$.

The error location circuits 74a' and 74b' include registers and multipliers and three banks 76a–76c of "exclusive or" gates and are similar to those described above for FIG. 8 except for different initial values. The derivative of the error evaluation polynomial is provided from bank 76c' whereas, the error location polynomial is provided from banks 76b' and 76a' of "exclusive or" gates, as shown.

A U-way parallel root search that also computes $\alpha^{-(n-1-j)(L+1)}\sigma'(\alpha^{-i})$ can be provided by the U-way parallel root search circuit and modifying the root circuit to have the root search circuit calculate the derivative of the error-locator polynomial in a similar manner, as shown above for the two way circuits 70, 70' in FIGS. 8 and 9.

Let $v=uj+1$. Then

1) Define $reg_i^{(l)}(0)=\alpha^{-(L+i)l}\sigma_i$ and the iterative relationship $$reg_i^{(l)}(j)=\alpha^{-(L+i)u}reg_i(j-1)$$

for l=0, ..., u-1, we have $$\alpha^{-(uj+l)L}\sigma(\alpha^{-(uj+l)}) = \sum_{i=0}^{k} reg_i^l(j) \quad \text{and}$$

$$\alpha^{-(uj)(L+1)}\sigma'(\alpha^{-(uj+l)}) = \sum_{i \text{ is odd}} reg_i^l(j)$$

for $0 \leq j \leq (n-1)/u$. This U-way shared parallel circuit searches locations from 0 to n-1.

The U-way parallel, shared circuit can search locations from n-1 to 0. By defining $reg_i^{(l)}(0)=\alpha^{(L+i)(l+1-n)}\sigma_i$ and the iterative relationship $$reg_i^{(l)}(j)=\alpha^{(L+i)u}reg_i(j-1)$$

for l=0, ..., u-1, provides $$\alpha^{-(n-uj-l)L}\sigma(\alpha^{-(n-uj-l)}) = \sum_{i=0}^{k} reg_i^l(j) \quad \text{and}$$

$$\alpha^{-(n-uj-l)(L+1)}\sigma'(\alpha^{-(n-uj-l)}) = \sum_{i \text{ is odd}} reg_i^l(j)$$

for $0 \leq j \leq (n-1)/u$.

Therefore, one of advantage of the arrangement of the shared circuits 70, 70' for the two way case or for the U-way case is that the denominator of equation (12) is readily available from the root search circuit without the need to compute the derivative $\sigma'(\alpha^{-j})$ of the error location polynomial $\sigma(\alpha^{-j})$.

Figure 10:
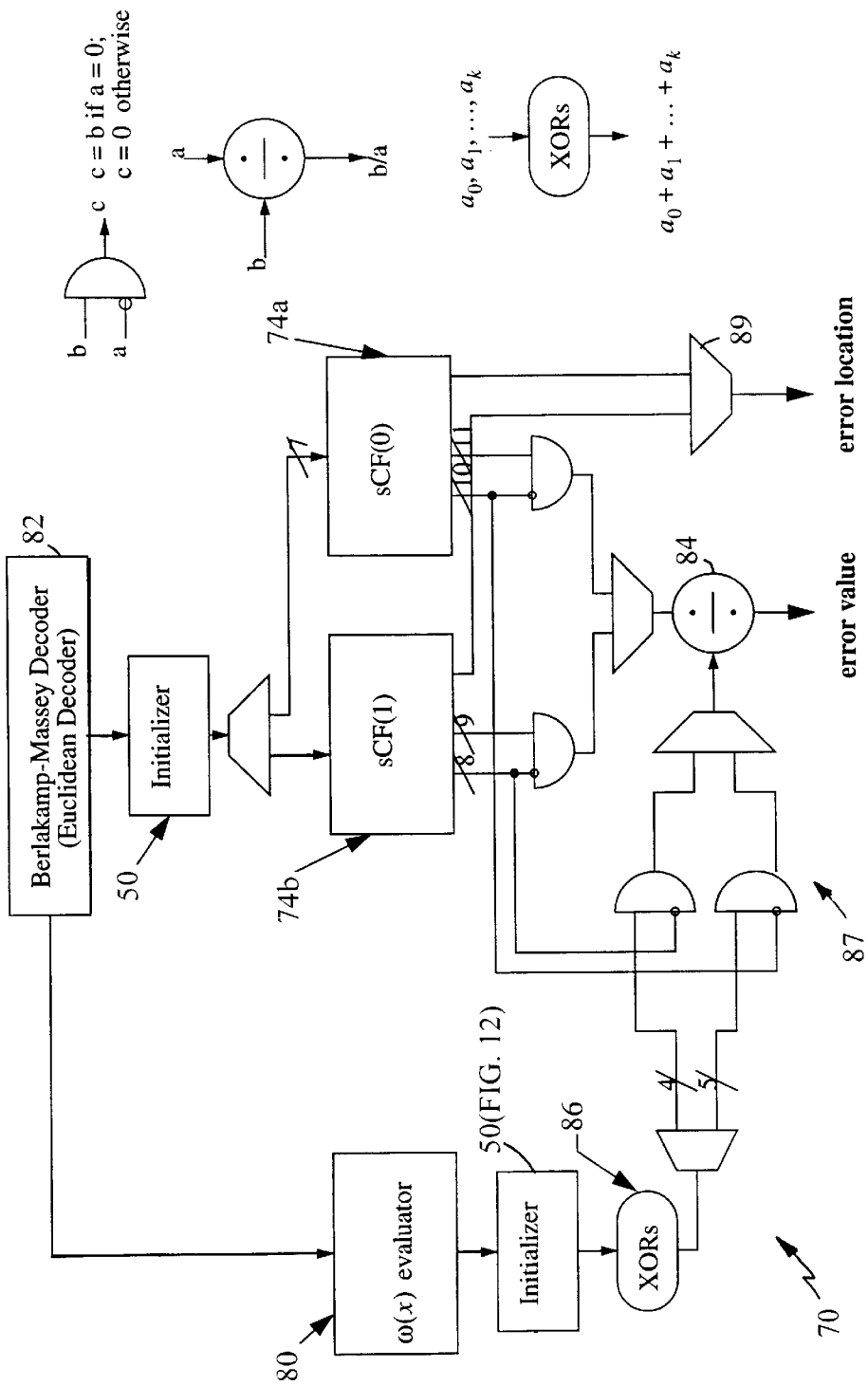
FIG. 10 is a detailed diagram of the error search and evaluator circuit of FIG. 8.

Referring to FIG. 10, the parallel combined root search and error evaluator circuit 70 includes two-way parallel root search circuits 74a, 74b that share circuitry with an error evaluator circuit 80. The circuit 70 includes a decoder 82 that uses the Berlekamp-Massey decoding algorithm or Euclidean algorithm to provide at decoder outputs both error-locator polynomial that is fed to the root search circuits 74a, 74b.

$$\sigma(\chi) = \sum_{l=0}^{k} \sigma_l \chi^l$$

and error-value polynomial that is fed to the error evaluator circuit 80.

$$\omega(\chi) = \sum_{l=0}^{k} \omega_l \chi^l$$

The error-locator polynomial $\sigma(\chi)$ fed to the two-way parallel combined root search circuit 74a, 74b and provides the roots of the error location polynomial and the derivative calculation of $\sigma(\chi)$ which is carried out by the circuits 74a, 74b as shown. Since the initial values in the registers of sCF(1) are $$\sigma_0, \sigma_1\alpha, \ldots, \sigma_k\alpha^k$$

the coefficients of $\sigma(\chi)$ are provided from an initializer 50 (as will be described in FIG. 12). The initializer 50 accepts the coefficients of $\sigma(\chi)$ as input and outputs initial values $\sigma_0$, $\sigma_1$, ..., $\sigma_k$ for the first root search circuit at the first cycle time, and outputs initial values $\sigma_0$, $\sigma_1\alpha$, ..., $\sigma_k\alpha^k$ for the second root search circuit at the second cycle time. These two sets of outputs are used as initial values in the registers (FIG. 8) of the parallel shared search/evaluator circuits 74a and 74b. The output of circuits 74a, 74b will be $\sigma(\alpha^{-(2j+l)})$ $\sigma'(\alpha^{-(2j+l)})$ and location 2j+l, respectively for l=0 and 1.

While the processors 74a, 74b are running, the $\omega(\chi)$ evaluator circuit 80 (FIG. 13) is also running. This evaluator 80 accepts the coefficients of $\omega(\chi)$ from a Berlakamp-Massey decoder 82 as input, and outputs to an initializer 50 (FIG. 12) $w_i\alpha^{-2ij}$ for i=0,1, . . . , k at every cycle time j. It is known that if 2j is an error location, then sCF(0) will output $\sigma(\alpha^{-2j})$=0, $\alpha^{-2j}\sigma'(\alpha^{-2j})$ and the location 2j. Thus, by directly dividing the output via a divider 84 $\alpha^{-2j}\sigma'(\alpha^{-2j})$ of sCF(0) by the summation of the output of the evaluator 80, the error value $l_{2j}$ is obtained. If 2j+1 is an error-location, the values output from the evaluator 80 cannot be used directly. The initializer 50 is used to produce values $\omega_i\alpha^{-(2j+1)i}$, i=0,1, . . . , k from the evaluator 80 that can be used to evaluate the error evaluation polynomial $\omega(\chi)$. Thus, the output of the evaluator 80 is sent to initializer 50. Initializer 50 outputs $\omega_i\alpha^{-2j}$, i=0,1, . . . , k at the first cycle time and $\omega_i\alpha^{-(2j+1)}$, i=0,1, . . . , k at the second cycle time. Each of the sets of these two outputs are added together, respectively, by the "exclusive Or" gates 86. The output of the "exclusive Or" gates are $\omega(\alpha^{-2j})$ and $\omega(\alpha^{-2j-1})$, respectively.

The processors 74a and 74b are each comprised of gates that have two inputs a and b and output c such that c=b if a=0, and c=0 otherwise. Thus, when 2j+1 is an error location, the inputs to the divider 84 are $$\alpha^{-(L+1)(2j+l)}\sigma'(\alpha^{-(2j+l)}) \text{ and } \omega(\alpha^{-(2j+l)}),$$

where f=0 or 1. The divider 84 outputs the error values $$e_{2j+lL} = \frac{\omega(\alpha^{-(2j+l)})}{\alpha^{-(L+1)(2j+l)}\sigma'(\alpha^{-(2j+l)})}.$$

The other output of the decoder circuit 84 is the error location.

Figure 11:
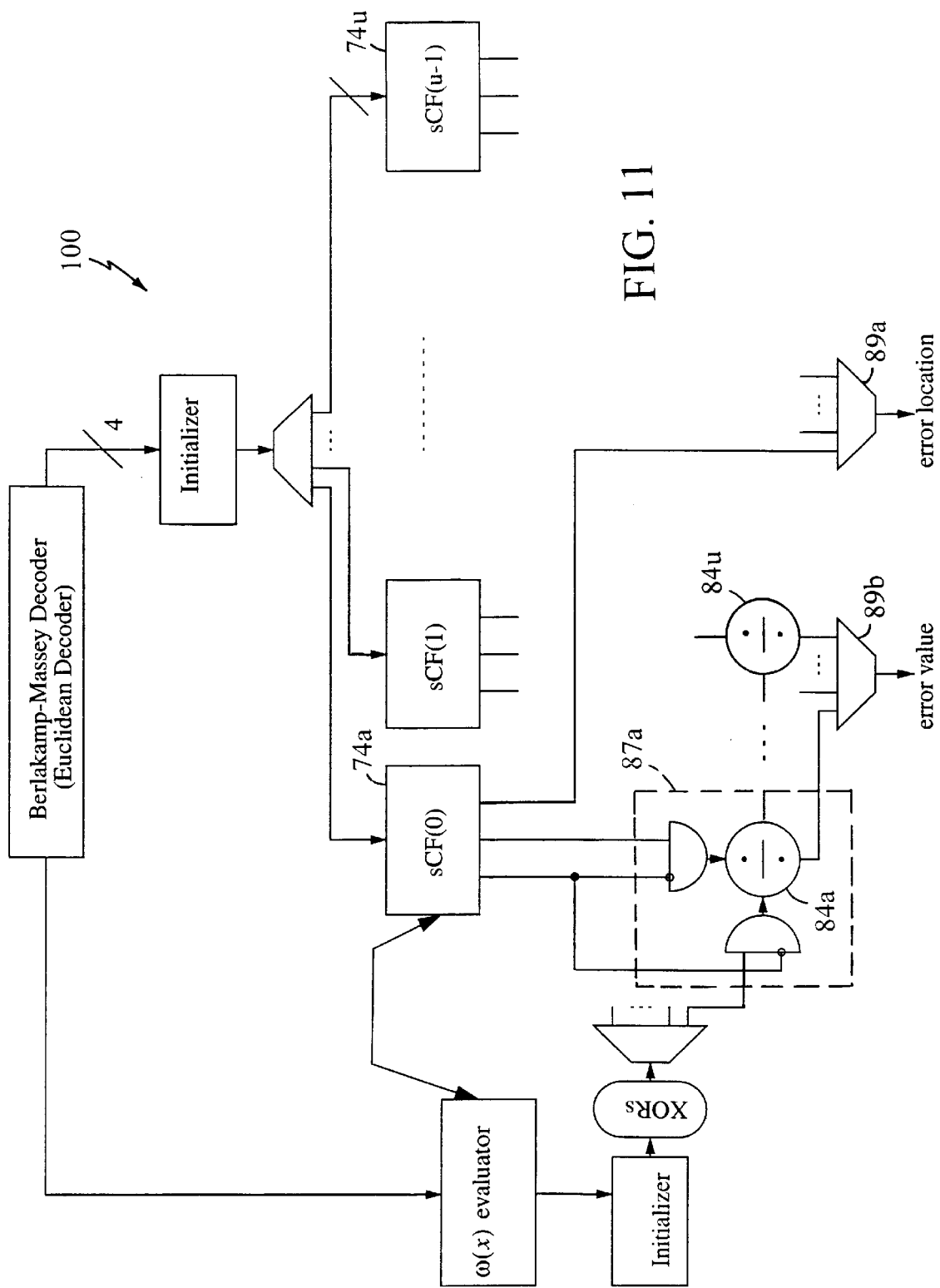
FIG. 11 is a block diagram of a generalized U-way error search and evaluator circuit.

Referring now to FIG. 11, a general circuit 100 for a U-way parallel combined Chien search and Forney formula using a similar approach, as described in FIG. 10, is shown. The circuit 100 includes circuits 74a–74u coupled to data selectors 89a, 89b. Multiplexer 89a provides the error location and has as inputs the outputs of the circuits 74a–74u. Multiplexer 89b produces the error value and has as inputs the output of dividers 84a–84u. Logic circuits 87a–87u are replicated for each input to the multiplexer 89b. The other elements are generally as in FIG. 10

It should be noted that the circuit for evaluating $\omega(\chi)$ could be omitted to save gate counts. However, without the circuit for evaluating $\omega(\chi)$ in parallel, all of the error locations would need to be stored and at the end of root search, additional cycles would be needed to compute the error values.

Therefore, a circuit for evaluating $\omega(\chi)$ in parallel to the root search reduces the decoding delay while maintaining approximately the same gate counts. Also each value of $\omega(\chi)$ can be provided instead of the initializer circuit 50. This may prove to be a more costly implementation.

Figure 12:
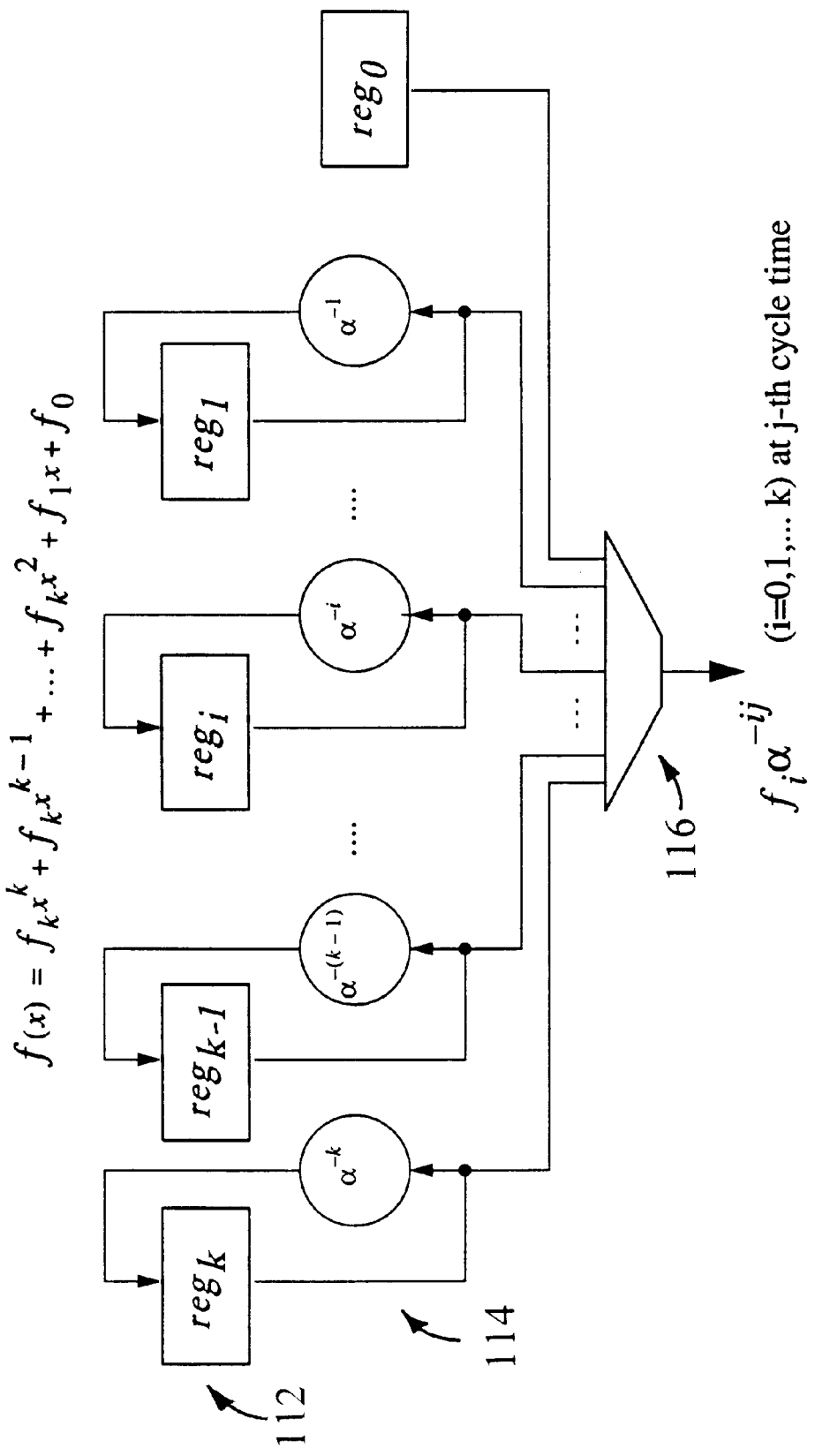
FIG. 12 is a block diagram of an initializer circuit.
Figure 13:
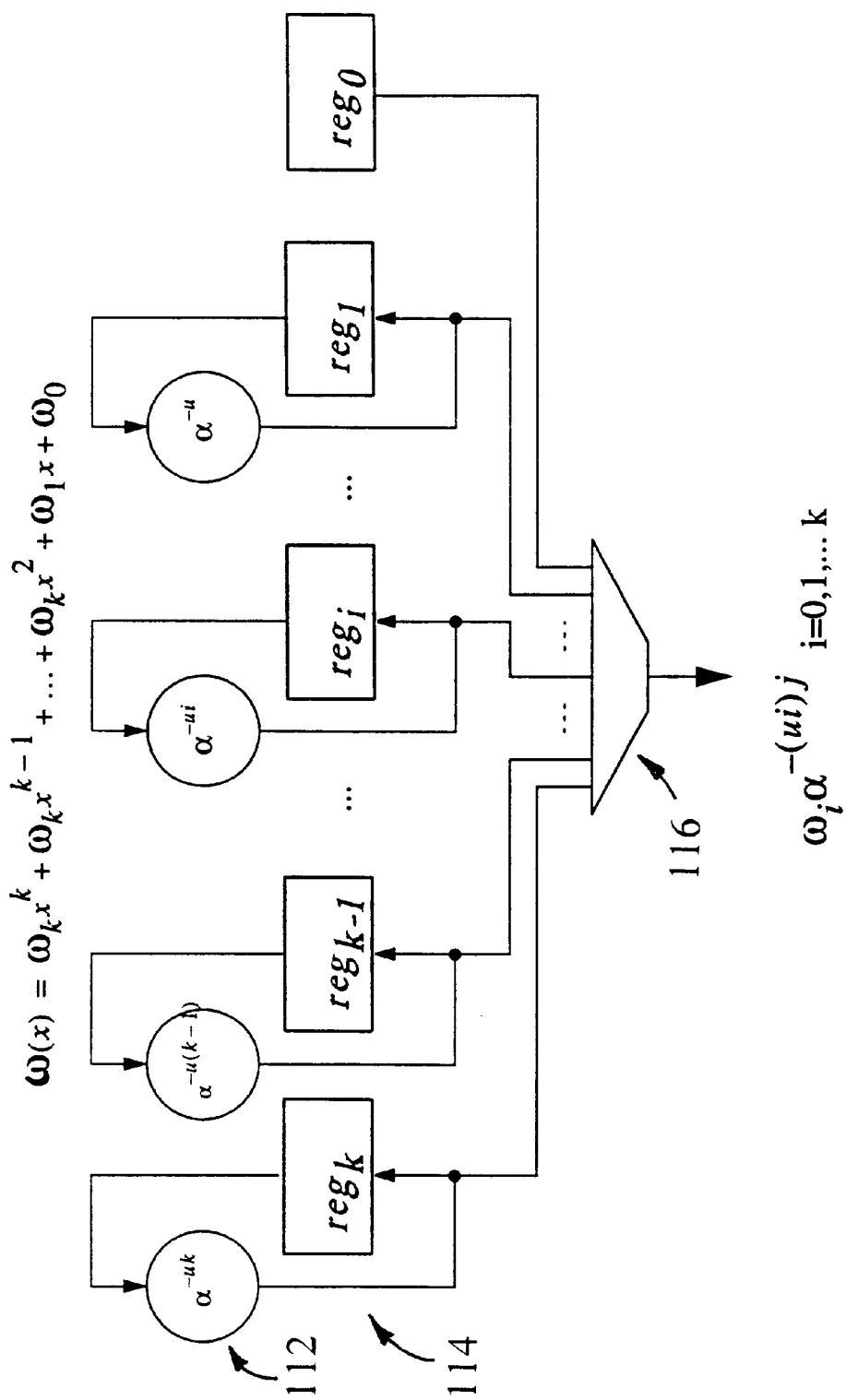
FIG. 13 is a block diagram of an error evaluator circuit.

Referring now to FIGS. 12 and 13 initializer circuit 50 and initializer circuit 20 are shown. These circuits use register 112, multiplier 114 and a multiplexer 116 to output constants for the multipliers in the search circuits described above. FIG. 12 shows a generalized initializer 50 for producing initial values for circuits of FIGS. 4 and 5 whereas, FIG. 13 shows a generalized circuit for producing initial values for the evaluator circuit 82 in FIGS. 10 and 11.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A decoder for decoding block error correction codes comprises:
   a first search circuit that evaluates an error location polynomial to find a root corresponding to an error location;
   a second search circuit that evaluates the error location polynomial to find a root corresponding to an error location; and
   a multiplexer fed by the first search circuit and the second search circuit to produce an error location from a said root.

2. The decoder of claim 1 wherein the first and second search circuits each comprise respectively a storage device for holding a first initial value and a multiplier device for multiplying the contents of the storage device by a coefficient.

3. The decoder of claim 2 wherein the initial values of storage devices of the first search circuit further comprise an initializer circuit to produce initial values for the storage devices of the first search circuit and the second search circuit.

4. The decoder of claim 3 wherein the initializer circuit produces the initial values for the second search circuit from the initial values of the first search circuit.

5. The decoder of claim 1 wherein said first search circuit and said second search circuit iteratively find roots of an error location polynomial starting from an initial iteration of the polynomial to the last iteration of the polynomial.

6. The decoder of claim 5 wherein the first search circuit and the second search circuit and multiplexer implement the following equations:

$$\sigma(\alpha^{-(2j)})=\text{reg}_k^{(0)}(j)+\text{reg}_{k-1}^{(0)}(j)+ \ldots +\text{reg}_1^{(0)}(j)+\text{reg}_0^{(0)}(j)$$

for the second search circuit and $$\sigma(\alpha^{-(2j+1)})=\text{reg}_k^{(1)}(j)+\text{reg}_{k-1}^{(1)}(j)+ \ldots +\text{reg}_1^{(1)}(j)+\text{reg}_0^{(1)}(j)$$

for the second search circuit.

7. The decoder of claim 1 wherein said first search circuit and said second search circuit iteratively find roots of an error location polynomial starting from the last iteration of the polynomial to the first iteration of the polynomial.

8. The decoder of claim 5 wherein the first search circuit and the second search circuit and multiplexer implement the following equation:

$$\sigma(\alpha^{-(n-2j-l)})=\text{reg}_k^{(l)}(j)+\text{reg}_{k-1}^{(l)}(j)+ \ldots +\text{reg}_1^{(l)}(j)+\text{reg}_0^{(l)}(j)$$

for $0 \leq j \leq (n-1)/2$, where l=0 and 1.

9. The decoder of claim 1 further comprising a plurality of additional search circuits, each search circuit initialized with corresponding initial values, to find roots of the error location polynomial that correspond to an error location; and
   wherein the multiplexer is fed by each of the plurality of additional search circuits to produce an error location from the error location polynomial.

10. The decoder of claim 9 wherein the first and second search circuits and each of the plurality of additional search circuits comprise a storage device to hold initial values assigned to each of the respective search circuits and a multiplier device for multiplying the contents of the storage device by a coefficient.

11. The decoder of claim 10 wherein the initial values of the storage devices of the first search circuit are provided from the error location polynomial and wherein the decoder further comprises:

an initializer circuit for initializing the storage devices of the second search circuit and the plurality of additional search circuits.

12. The decoder of claim 11 wherein the initializer circuit produces initial values for the second search circuit and the plurality of additional search circuits by iteratively multiplying values of a previous one of the iterations of the search circuits by a constant.

13. The decoder of claim 9 wherein said first search circuit and said second search circuit iteratively find roots of an error location polynomial starting from an initial iteration of the polynomial to the last iteration of the polynomial.

14. The decoder of claim 13 wherein the first search circuit, the second search circuit and plurality of additional search circuits and multiplexer implement the following equation:

$$\sigma(\alpha^{-(uj+l)}) = \text{reg}_k^{(l)}(j) + \text{reg}_{k-1}^{(l)}(j) + \ldots + \text{reg}_1^{(l)}(j) + \text{reg}_0^{(l)}(j)$$

with $0 \leq j \leq (n-1)/u$.

15. The decoder of claim 9 wherein said first search circuit and said second search circuit iteratively find roots of an error location polynomial starting from the last iteration of the polynomial to the first iteration of the polynomial.

16. The decoder of claim 15 wherein the first search circuit, the second search circuit and plurality of additional search circuits and multiplexer implement the following equation:

$$\sigma(\alpha^{-(n-uj-l)}) = \text{reg}_k^{(l)}(j) + \text{reg}_{k-1}^{(l)}(j) + \ldots + \text{reg}_1^{(l)}(j) + \text{reg}_0^{(l)}(j)$$

with $0 \leq j \leq (n-1)/u$.

17. A decoder for decoding block codes comprises:

a parallel error location polynomial search circuit comprising:
a first search circuit that evaluates an error location polynomial to find a root that corresponds to an error location, said first search circuit further comprising:
a first modulo adder circuit that adds odd terms of the error location polynomial to produce a derivative of the error location polynomial;
a second search circuit that evaluates the error location polynomial to find a root that corresponds to an error location, said second search circuit further comprising:
a second modulo adder circuit that adds odd terms of the error location polynomial to produce a derivative of the error location polynomial;
a first multiplexer fed by the first search circuit and the second search circuit to produce an error location from a said root;
a second multiplexer fed by the error locator polynomial derivatives from the first and second modulo adders;
an error evaluation circuit that produces an error evaluator polynomial; and
a logic circuit including a divider circuit to divide the error evaluator polynomial by the output from the second multiplexer.

18. The decoder of claim 17 further comprising an initializer circuit that receives the error evaluator polynomial from the error evaluator circuit to produce error values for error locations identified by the error location polynomial circuit.

19. The decoder of claim 18 wherein the initializer circuit produces initial values for error locations identified by the second search circuit.

20. The decoder circuit of claim 17 further comprising a plurality of additional root search circuits.

21. The decoder of claim 17 further comprising an initializer circuit that receives,the error evaluator polynomial from the error evaluator circuit to produce error values for error locations identified each of the root search circuits.

22. A method of decoding an error correcting block code comprises:

evaluating an error location polynomial produced from an error location polynomial generation circuit by applying the error location polynomial to a parallel root search circuit that searches for roots of the error location polynomial in a parallel manner.

23. The method of claim 22 wherein applying further comprises applying the error location polynomial to a pair of root search circuits.

24. The method of claim 22 wherein applying applies the error location polynomial to a plurality of search circuits.

25. The method of claim 23 further comprising alternatively selecting from the first and the second search circuits and the plurality of search circuits to provide error locations for the error location polynomial.

26. A decoder to decode block error correction codes, comprising:

parallel search circuits that evaluate a single error location polynomial to find roots that correspond to error locations of data from a storage medium;
wherein a first root $\sigma(\alpha^{-(2j)})$ of the single error location polynomial comprises:

$$\sigma(\alpha^{-(2j)}) = \text{reg}_k^{(0)}(j) + \text{reg}_{k-1}^{(0)}(j) + \ldots + \text{reg}_1^{(0)}(j) + \text{reg}_0^{(0)}(j); \text{ and}$$

wherein a second root $\sigma(\alpha^{-(2j+1)})$ of the single error location polynomial comprises:

$$\sigma(\alpha^{-(2j+1)}) = \text{reg}_k^{(1)}(j) + \text{reg}_{k-1}^{(1)}(j) + \ldots + \text{reg}_1^{(1)}(j) + \text{reg}_0^{(1)}(j)$$

with values for reg comprising data register values.

27. The decoder of claim 26, further comprising:
circuitry to obtain an error location from the roots.

28. The decoder of claim 27, wherein the parallel search circuits and the circuitry implement the following equation:

$$\sigma(\alpha^{-(n-2j-l)}) = \text{reg}_k^{(l)}(j) + \text{reg}_{k-1}^{(l)}(j) + \ldots + \text{reg}_1^{(l)}(j) + \text{reg}_0^{(l)}(j)$$

for $0 \leq j \leq (n-1)/2$, where l=0 and 1.

29. The decoder of claim 26, wherein the parallel search circuits comprise first and second search circuits.

30. A decoder comprising:

a generator circuit that generates an error location polynomial from error correcting code symbols that correspond to data on a storage medium;
parallel search circuits that search for roots of the error location polynomial; and
an evaluator circuit that evaluates errors in the error correcting code symbols at locations that correspond to the roots.

31. The decoder of claim 30, wherein each of the parallel search circuits includes a storage device for holding a first initial value and a multiplier device for multiplying contents of the storage device by a coefficient.

32. The decoder of claim 31, wherein the parallel search circuits iteratively find roots of the error location polynomial starting from an initial iteration of the error location polynomial using the initial value to a last iteration of the error location polynomial.

33. The decoder of claim 32, wherein a first root $\sigma(\alpha^{-(2j)})$ of the single error location polynomial comprises:

$$\sigma(\alpha^{-(2j)})=\text{reg}_k^{(0)}(j)+\text{reg}_{k-1}^{(0)}(j)+\ldots+\text{reg}_1^{(0)}(j)+\text{reg}_0^{(0)}(j); \text{ and}$$

wherein a second root $\sigma(\alpha^{-(2j+1)})$ of the single error location polynomial comprises:

$$\sigma(\alpha^{-(2j)})=\text{reg}_k^{(0)}(j)+\text{reg}_{k-1}^{(0)}(j)+\ldots+\text{reg}_1^{(0)}(j)+\text{reg}_0^{(0)}(j); \text{ and}$$

with values for reg comprising data register values.

34. The decoder of claim 32, wherein the parallel search circuits and other circuitry implement the following equation:

$$\sigma(\alpha-(n-2j-l))=\text{reg}k(l)(j)+\text{reg}k-1(l)(j)+\ldots+\text{reg}1(l)(j)+\text{reg}0(l)(j)$$

for $0 \leq j \leq (n-1)/2$, where l=0 and 1.

35. The decoder of claim 30, wherein the parallel search circuits iteratively find roots of the error location polynomial starting from a last iteration of the error location polynomial to a first iteration of the error location polynomial.

36. A method comprising:

generating an error location polynomial from error correcting code symbols that correspond to data on a storage medium;

searching for roots of the error location polynomial via parallel search circuits; and evaluating errors in the error correcting code symbols at locations that correspond to the roots.

37. The method of claim 36, further comprising:

storing, in each of the parallel search circuits, a first initial value; and multiplying contents of the storage device by a coefficient.

38. The method of claim 37, wherein the parallel search circuits iteratively find roots of the error location polynomial starting from an initial iteration of the error location polynomial using the initial value to a last iteration of the error location polynomial.

39. The method of claim 38, wherein a first root $\sigma(\alpha^{-(2j)})$ of the single error location polynomial comprises:

$$\sigma(\alpha^{-(2j)})=\text{reg}_k^{(0)}(j)+\text{reg}_{k-1}^{(0)}(j)+\ldots+\text{reg}_1^{(0)}(j)+\text{reg}_0^{(0)}(j); \text{ and}$$

wherein a second root $\sigma(\alpha^{-(2j+1)})$ of the single error location polynomial comprises:

$$\sigma(\alpha^{-(2j+1)})=\text{reg}_k^{(l)}(j)+\text{reg}_{k-1}^{(l)}(j)+\ldots+\text{reg}_1^{(l)}(j)+\text{reg}_0^{(l)}(j),$$

with values for reg comprising data register values.

40. The method of claim 38, wherein the parallel search circuits and other circuitry implement the following equation:

$$\sigma(\alpha-(n-2j-l))=\text{reg}k(l)(j)+\text{reg}k-1(l)(j)+\ldots+\text{reg}1(l)(j)+\text{reg}0(l)(j)$$

for $0 \leq j \leq (n-1)/2$, where l=0 and 1.

41. The method of claim 36, wherein the parallel search circuits iteratively find roots of the error location polynomial starting from a last iteration of the error location polynomial to a first iteration of the error location polynomial.

42. A method comprising:

searching for roots of a single error location polynomial using parallel search circuits.

43. The method of claim 42, wherein:

a first root $\sigma(\alpha^{-(2j)})$ of the single error location polynomial comprises:

$$\sigma(\alpha^{-(2j)})=\text{reg}_k^{(0)}(j)+\text{reg}_{k-1}^{(0)}(j)+\ldots+\text{reg}_1^{(0)}(j)+\text{reg}_0^{(0)}(j); \text{ and}$$

a second root $\sigma(\alpha^{-(2j+1)})$ of the single error location polynomial comprises:

$$\sigma(\alpha^{-(2j+1)})=\text{reg}_k^{(1)}(j)+\text{reg}_{k-1}^{(1)}(j)+\ldots+\text{reg}_1^{(1)}(j)+\text{reg}_0^{(1)}(j),$$

with values for reg comprising data register values.

44. The method of claim 42, further comprising obtaining an error location from the roots.

45. The method of claim 42, wherein searching is performed using a Chien search algorithm.

46. The method of claim 42, wherein the parallel search circuits and additional circuitry implement the following equation:

$$\sigma(\alpha^{-(n-2j-l)})=\text{reg}_k^{(l)}(j)+\text{reg}_{k-1}^{(l)}(j)+\ldots+\text{reg}_1^{(l)}(j)+\text{reg}_0^{(l)}(j)$$

for $0 \leq j \leq (n-1)/2$, where l=0 and 1.

47. The method of claim 42, further comprising:

storing, in each of the parallel search circuits, a first initial value; and multiplying contents of the storage device by a coefficient.

48. The method of claim 47, wherein the parallel search circuits iteratively find roots of the error location polynomial starting from an initial iteration of the error location polynomial using the initial value to a last iteration of the error location polynomial.

49. The method of claim 42, further comprising:

selecting an output of one of the parallel search circuits for different cycles of a decoder.

50. The method of claim 42, wherein the parallel search circuits comprise U-way parallel search circuits.

51. A decoder for decoding block error correction codes, comprising:

means for evaluating a single error location polynomial to find a first root corresponding to an error location;

means for evaluating the single error location polynomial to find a second root corresponding to an error location; and means for producing an error location of the root based on the first and second roots.

52. The decoder of claim 51, wherein each of the means for evaluating comprise, respectively, a storage device for holding a first initial value and a multiplier device for multiplying the contents of the storage device by a coefficient.

53. The decoder of claim 52, wherein the means for evaluating comprise a first search circuit and a second search circuit.

54. The decoder of claim 53, further comprising an initializer circuit to produce initial values for the storage devices of the first search circuit and the second search circuit.

55. The decoder of claim 54, wherein the initializer circuit produces the initial values for the second search circuit from the initial values of the first search circuit.

56. The decoder of claim 51, wherein the means for evaluating iteratively find roots of an error location polynomial starting from an initial iteration of the polynomial to the last iteration of the polynomial.

57. The decoder of claim 51, wherein the first root $\sigma(\alpha^{-(2j)})$ of the error location polynomial comprises:

$$\sigma(\alpha^{-(2j)}) = \text{reg}_k^{(0)}(j) + \text{reg}_{k-1}^{(0)}(j) + \ldots + \text{reg}_1^{(0)}(j) + \text{reg}_0^{(0)}(j); \text{ and}$$

wherein the second root $\sigma(\alpha^{-(2j+1)})$ of the error location polynomial comprises:

$$\sigma(\alpha^{-(2j+1)}) = \text{reg}_k^{(1)}(j) + \text{reg}_{k-1}^{(1)}(j) + \ldots + \text{reg}_1^{(1)}(j) + \text{reg}_0^{(1)}(j),$$

with values for reg comprising data register values.

58. The decoder of claim 57, wherein the means for evaluating and means for producing implement the following equation:

$$\sigma(\alpha - (n-2j-l)) = \text{reg}k(l)(j) + \text{reg}k{-}1(l)(j) + \ldots + \text{reg}1(l)(j) + \text{reg}0(l)(j)$$

for $0 \leq j \leq (n-1)/2$, where l=0 and 1.

59. A decoder comprising:

means for generating a single error location polynomial from error correcting code symbols that correspond to data on a storage medium;

means for searching for roots of the single error location polynomial via parallel search circuits; and means for evaluating errors in the error correcting code symbols at locations that correspond to the roots.

60. The decoder of claim 59, further comprising:

means for storing, in each of the parallel search circuits, a first initial value; and means for multiplying contents of the storage device by a coefficient;

wherein the parallel search circuits iteratively find roots of the error location polynomial starting from an initial iteration of the error location polynomial using the initial value to a last iteration of the error location polynomials.

* * * * *